(12) United States Patent
Sakui et al.

(10) Patent No.: US 6,198,687 B1
(45) Date of Patent: *Mar. 6, 2001

(54) SEMICONDUCTOR MEMORY DEVICE HAVING A PLURALITY OF TRANSFER GATES AND IMPROVED WORD LINE AND COLUMN SELECT TIMING FOR HIGH SPEED WRITE OPERATIONS

(75) Inventors: Koji Sakui, Tokyo; Kazunori Ohuchi; Fujio Masuoka, both of Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/716,884

(22) Filed: Sep. 20, 1996

Related U.S. Application Data

(63) Continuation of application No. 07/969,363, filed on Oct. 30, 1992, now Pat. No. 5,596,543, which is a continuation of application No. 07/671,137, filed on Mar. 18, 1991, now Pat. No. 5,173,878, which is a continuation of application No. 07/274,483, filed on Nov. 22, 1988, now abandoned.

(30) Foreign Application Priority Data

Nov. 25, 1987 (JP) .................................................. 62-296817

(51) Int. Cl.[7] ............................. G11C 11/407; G11C 7/02
(52) U.S. Cl. ....................................... 365/233; 365/230.06
(58) Field of Search ................................. 395/189.05, 190, 395/193, 194, 210, 230.02, 233, 230.88, 432, 494; 711/105, 167; 365/230.06

(56) References Cited

U.S. PATENT DOCUMENTS 4,758,987 * 7/1988 Sakui ............................. 365/189.05
4,811,299 * 3/1989 Miyazawa et al. .................. 365/193

FOREIGN PATENT DOCUMENTS 61-142592 * 6/1986 (JP) .

* cited by examiner

*Primary Examiner*—Glenn Gossage
(74) *Attorney, Agent, or Firm*—Oblon, Spivak, McClelland, Maier & Neustadt, P.C.

(57) ABSTRACT

A semiconductor memory device which receives a row address strobe (RAS) signal and a column address strobe (CAS) signal from an external device. The device includes rewritable memory cells formed on a semiconductor substrate, a plurality of bit lines, a plurality of word lines, and a transfer gate coupled between the bit lines and input/output (I/O) lines and controlled by a column select line or signal. In one embodiment, a first transfer gate is connected between the bit lines and a second transfer gate, the second transfer gate connected between the first transfer gate and an input/output (I/O) line and controlled by a column select line (CSL). A third transfer gate may also by provided. The first transfer gate is driven in response to a clock signal which is enabled at substantially the same time as a word line of the plurality of word lines is selected during both read and write cycles. Thus, during a write cycle in which the CAS signal is enabled prior to the RAS signal, a selected CSL can be increased from a first voltage (VSS) to one of a second voltage (Vdd) and ½ Vdd as soon as a column address is input.

11 Claims, 10 Drawing Sheets

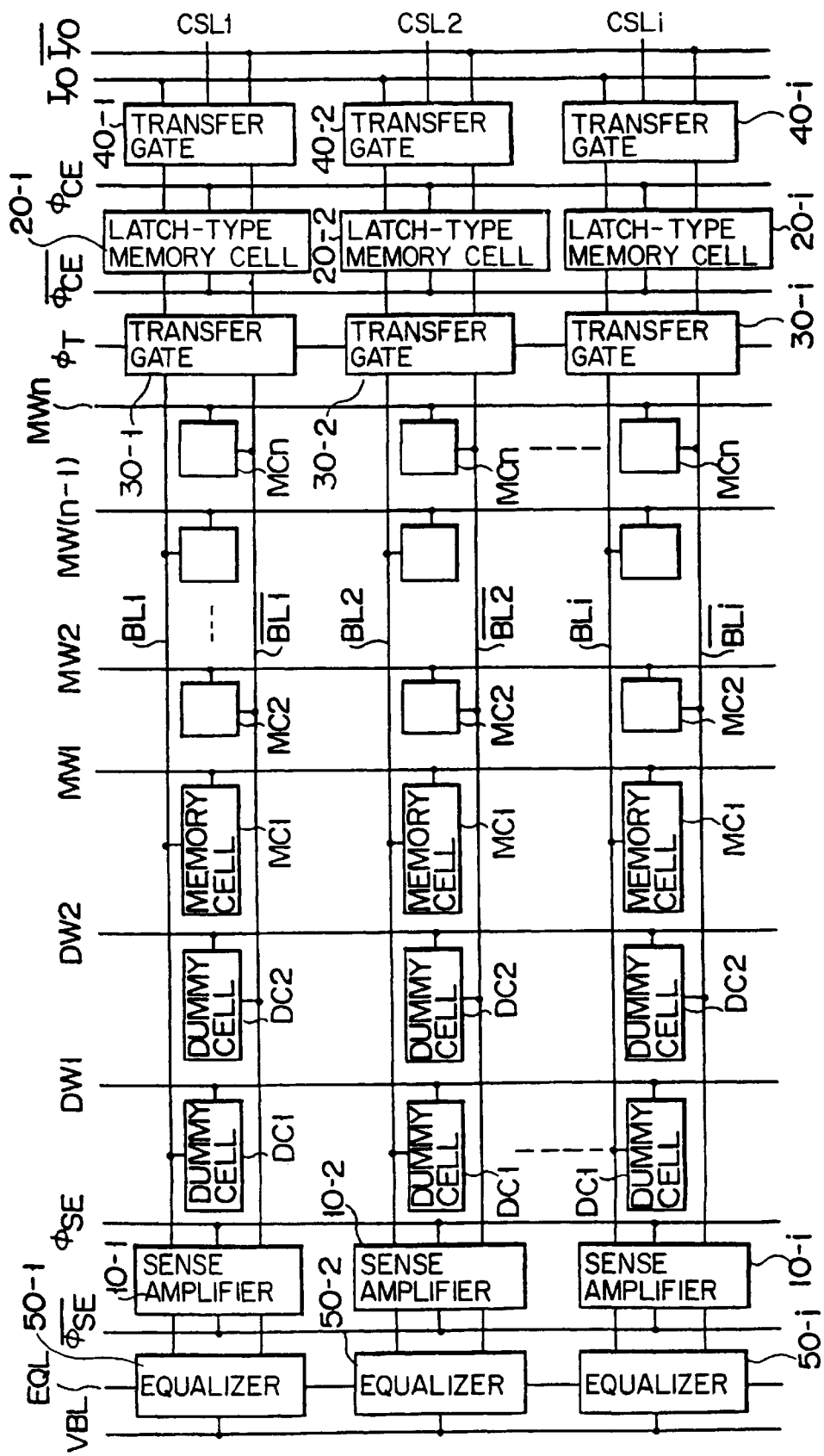
F I G. 1

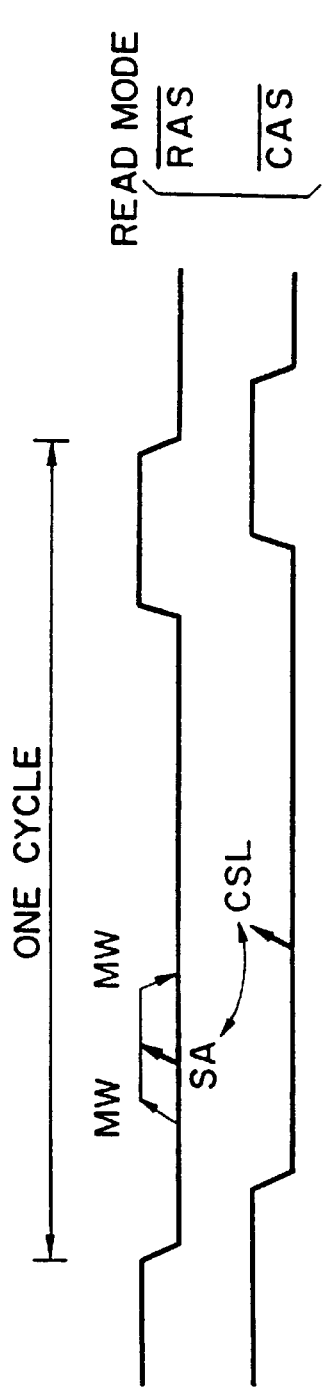
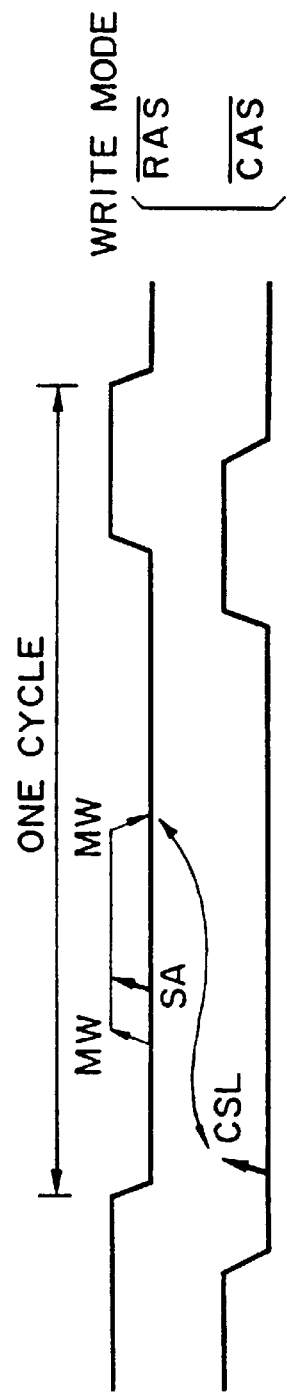
FIG. 2A
FIG. 2B
FIG. 2C
FIG. 2D

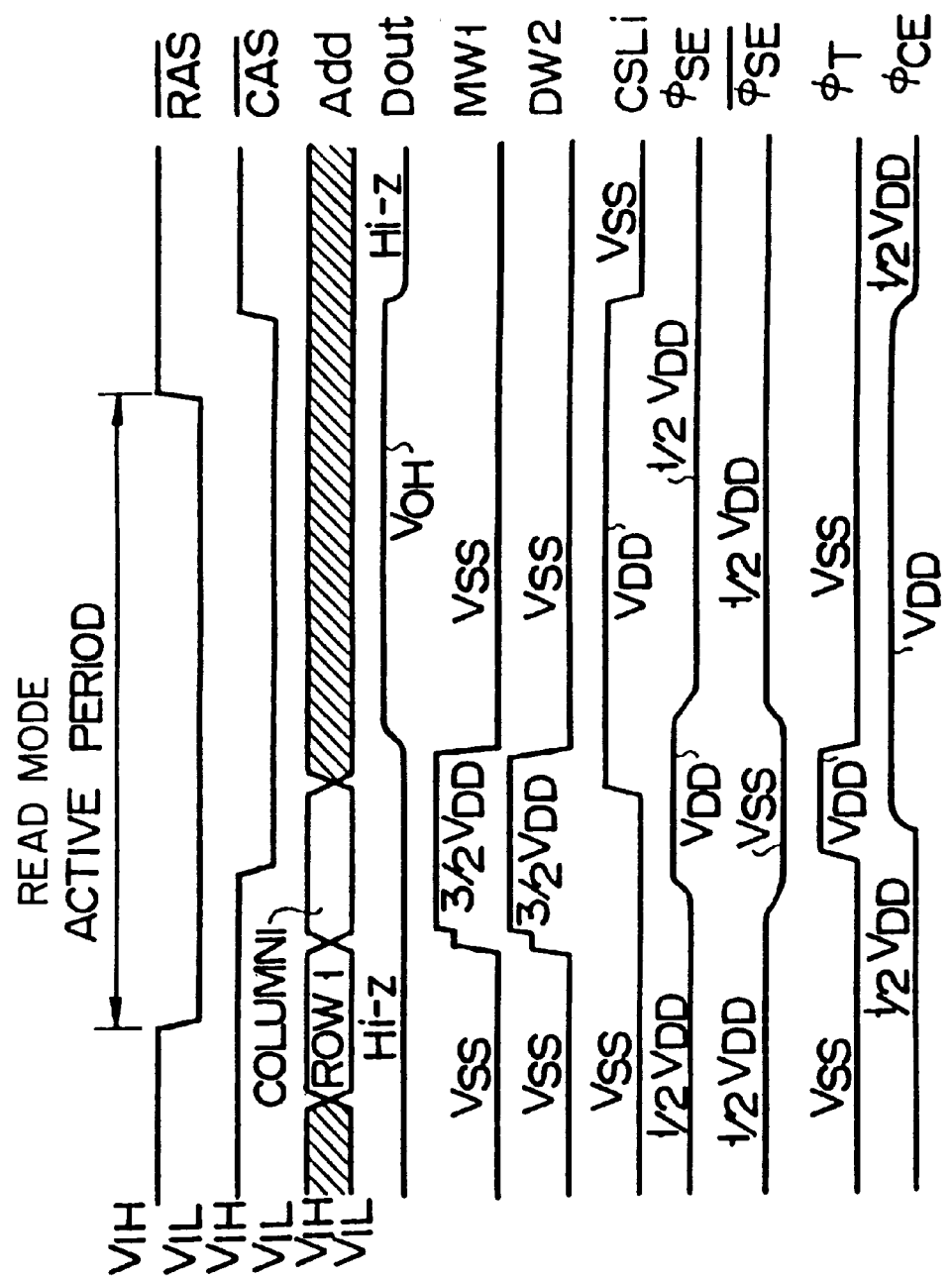

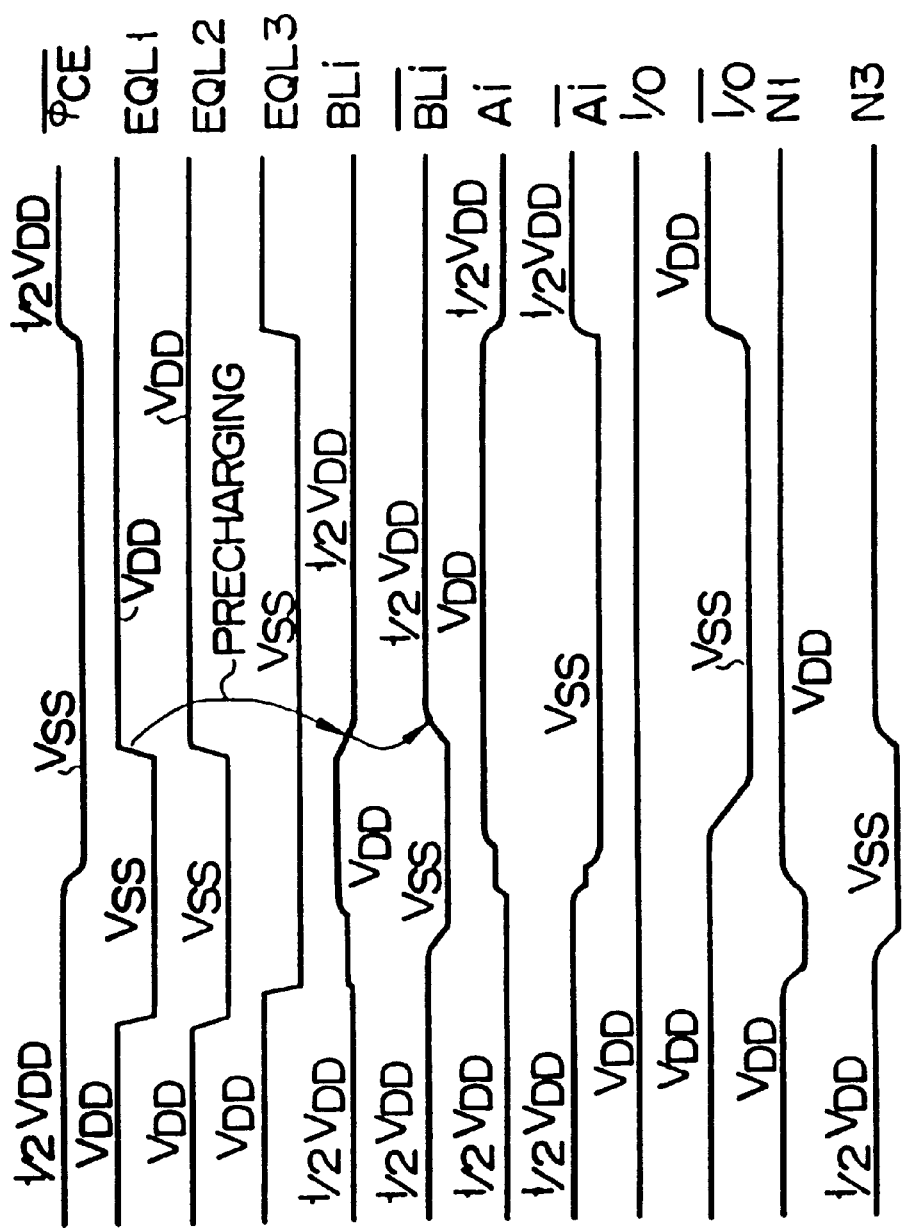

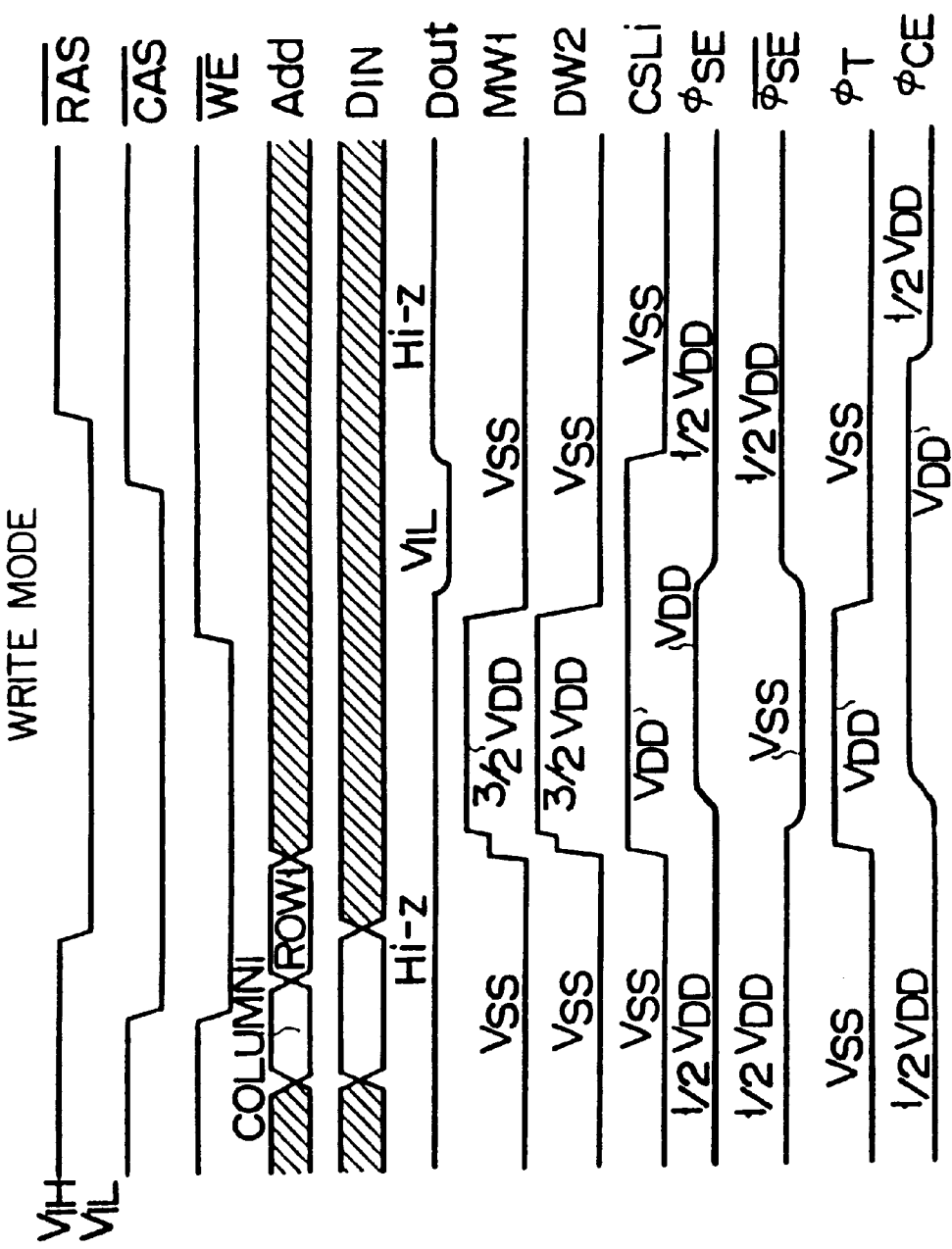

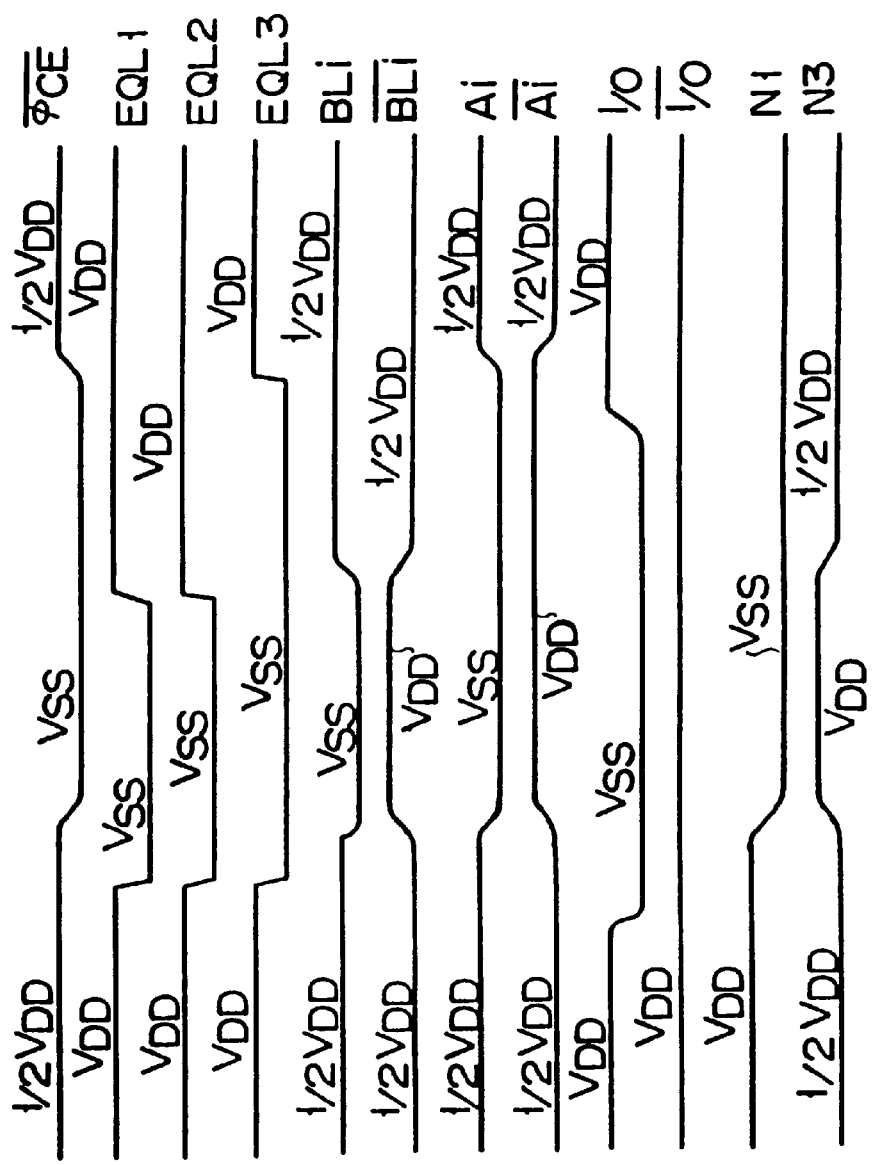

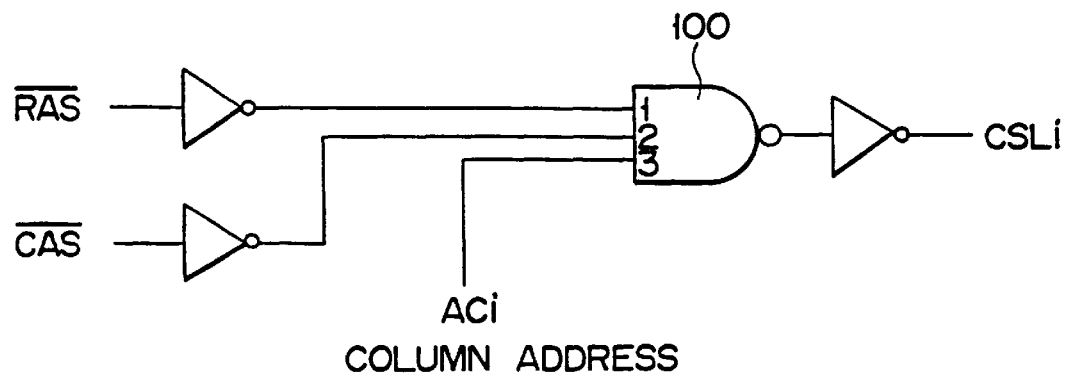
F I G. 7
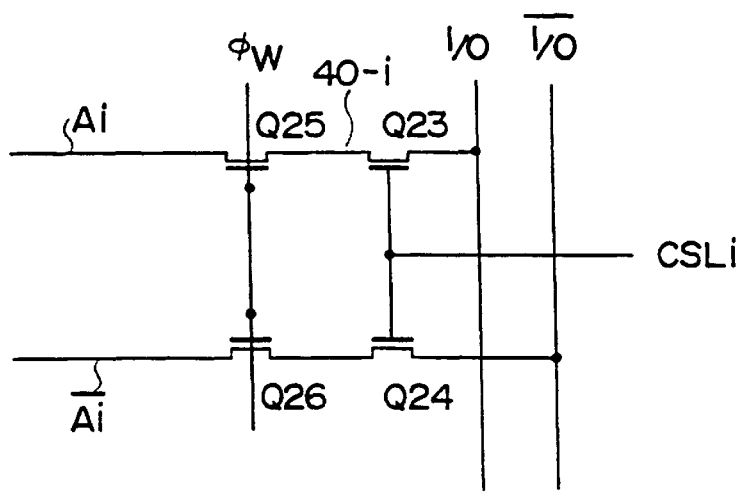
F I G. 9

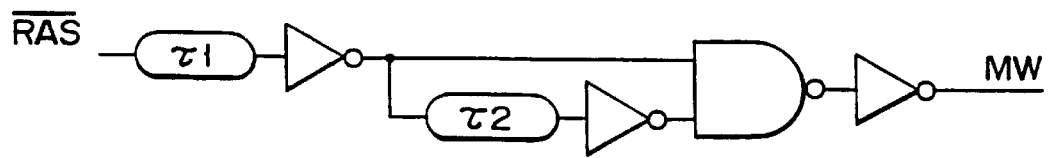
F I G. 8A
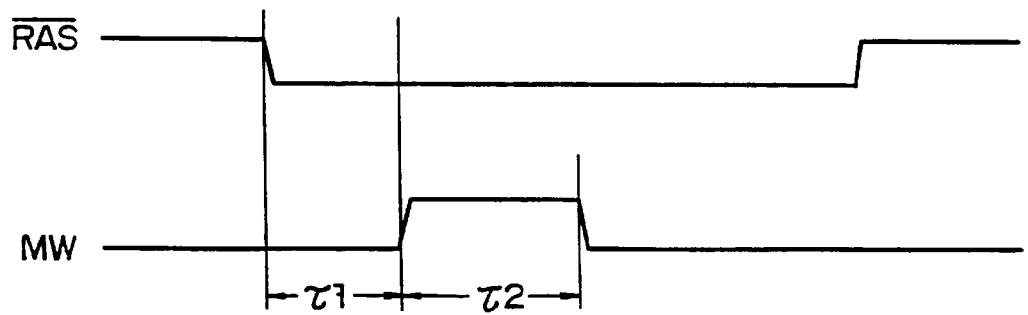
F I G. 8B

US 6,198,687 B1

SEMICONDUCTOR MEMORY DEVICE HAVING A PLURALITY OF TRANSFER GATES AND IMPROVED WORD LINE AND COLUMN SELECT TIMING FOR HIGH SPEED WRITE OPERATIONS

This is a continuation of U.S. patent application Ser. No. 07/969,363, filed Oct. 30, 1992, now U.S. Pat. No. 5,596,543, which is a continuation of U.S. patent application Ser. No. 07/671,137, filed Mar. 18, 1991, now U.S. Pat. No. 5,173,878, which is a continuation of U.S. patent application Ser. No. 07/274,483, filed Nov. 22, 1988, now abandoned.

BACKGROUND OF THE INVENTION

1. Field of the Invention

The present invention relates to a semiconductor memory device and, more particularly, to a method of accessing a dynamic Random Access Memory (dRAM) in which dynamic memory cells for individual cell access are integrated, and a dRAM system.

2. Description of the Related Art

A conventional semiconductor memory device is generally operated in response to a control signal from an external Central Processing Unit (CPU). In the dRAM, an upper address designation signal, a lower address designation signal, row address strobe $\overline{RAS}$, column address strobe $\overline{CAS}$, write trigger signal $\overline{WE}$, and the like are used. These control signals must be input from the external CPU or the like at a voltage, an order, and a timing which are prescribed by specifications of the semiconductor memory device so as to properly operate the semiconductor memory device.

The row address strobe (to be referred to as an $\overline{RAS}$ hereinafter) is a signal for selecting a mode which designates a row of the semiconductor memory device, and a column address strobe (to be referred to as a $\overline{CAS}$ hereinafter) is a signal for selecting a mode which designates a column of the semiconductor memory device. In both the read and write modes, signals $\overline{RAS}$ and $\overline{CAS}$ are always input in the order named.

SUMMARY OF THE INVENTION

A method of accessing a dRAM according to the present invention is characterized in that in a dRAM of an address multiplex system, the order of input of column and row addresses during a read cycle differs from that during a write cycle.

A dRAM system of the address multiplex type according to the present invention is characterized by comprising an address data selector for dividing the row and column addresses from a CPU into upper and lower addresses and time-divisionally supplying them to a dRAM chip, and a gate circuit for designating to the selector which of the upper and lower addresses is to be input first, in response to an external control signal.

According to the method of accessing the dRAM of the present invention, e.g., an arrangement in which a latch-type memory cell is arranged between a bit line and an input/output line is utilized. Thus, during a read cycle, $\overline{RAS}$ goes from "1" to "0" prior to $\overline{CAS}$. During a write cycle, on the other hand, $\overline{CAS}$ goes from "1" to "0" prior to $\overline{RAS}$. Therefore, no limitation is imposed on the timings of enabling the word line and CSL (column select line) in the write mode, thus ensuring a high-speed write operation of the dRAM and an easy designing thereof.

BRIEF DESCRIPTION OF THE DRAWINGS

FIG. 1 is a block diagram showing an arrangement of a main part of a dRAM according to an embodiment of the present invention;

FIGS. 2A, 2B, 2C, and 2D are timing charts for explaining read and write operations performed by the embodiment shown in FIG. 1;

FIGS. 5A to 5W are timing charts for explaining operations performed by the embodiment in FIG. 3 during a read cycle;

FIGS. 6A to 6Y are timing charts for explaining operations performed by the embodiment in FIG. 3 during a write cycle;

FIG. 7 is a circuit diagram showing an arrangement of a column select line decoder;

FIGS. 8A and 8B are a circuit diagram and timing chart for explaining an example of a driving operation of the word lines; and FIG. 9 is a circuit diagram showing a modification of a second transfer gate used in the embodiment in FIG. 3.

DETAILED DESCRIPTION OF THE PREFERRED EMBODIMENT

Figure 3:
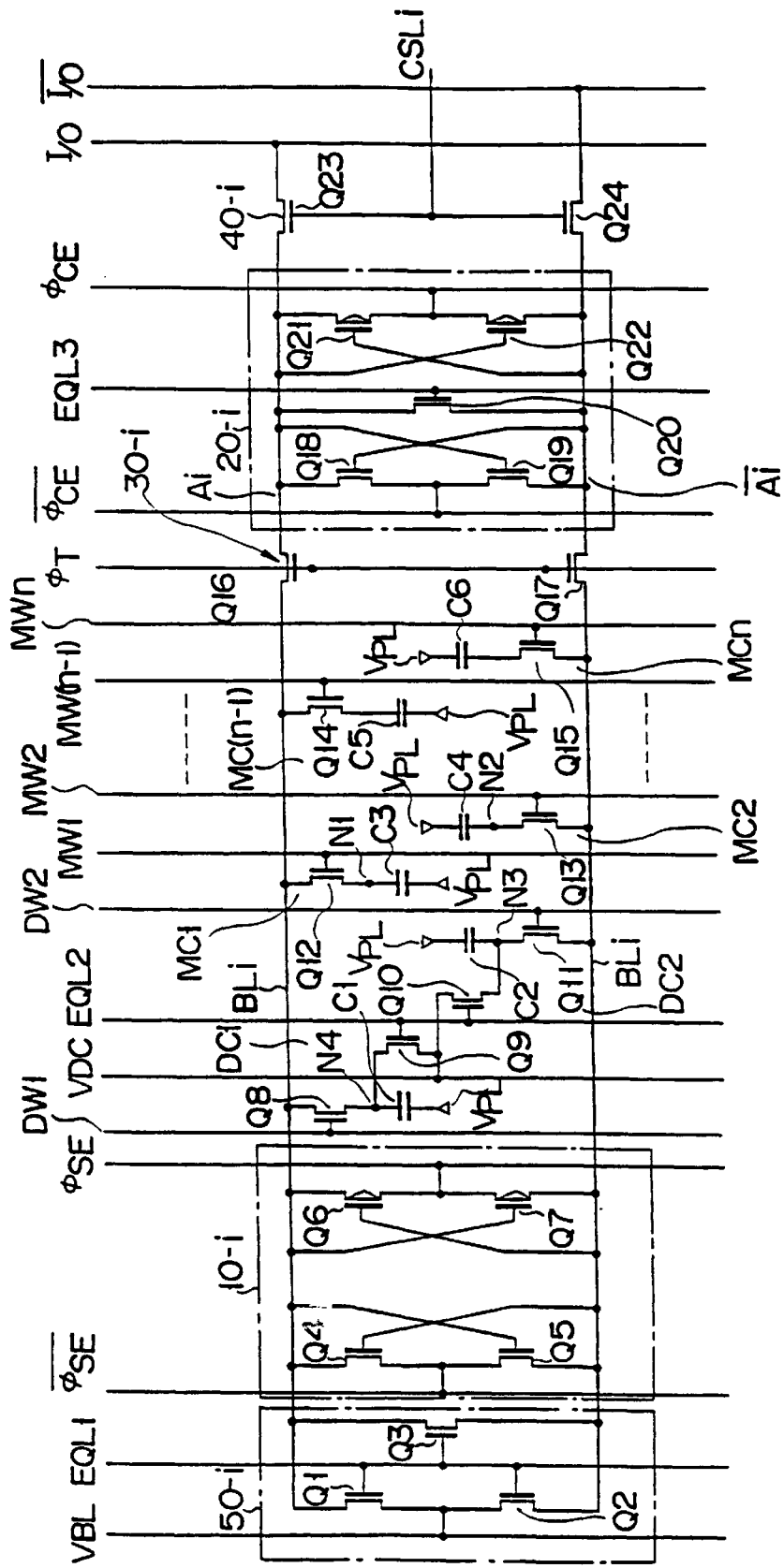
FIG. 3 is a diagram showing in detail an arrangement of the circuit shown in FIG. 1.

An embodiment of the present invention will now be described below, with reference to the accompanying drawings.

FIG. 1 shows an arrangement of a main part of a dRAM according to an embodiment. A plurality of pairs of bit lines BLi and $\overline{BLi}$ (i=1, 2, 3, . . . ) and a plurality of word lines MWn (n=1, 2, 3, . . . ) are formed such that they intersect each other on a semiconductor substrate, with dRAM cells MCn (n=1, 2, 3, . . . ) being arranged at the respective intersecting points. Each of dRAM cells MCn is selected and driven by a corresponding one of word lines MW, and data is exchanged between bit lines BL and $\overline{BL}$. Besides dRAM cells, each of bit line pairs BL and $\overline{BL}$ includes dummy cells DC1 and DC2 which are driven by dummy word lines DW1 and DW2, respectively. Bit line sense amplifiers 10 (10-1, 10-2, . . . ) for detecting the data read out at bit lines BL and $\overline{BL}$ are arranged at one ends of bit lines BL and $\overline{BL}$. Reference numerals 50 (50-1, 50-2, . . . ) denote circuits (to hereinafter be referred to as precharge circuits) for equalizing and precharging bit lines BL and $\overline{BL}$. Latch-type memory cells 20 (20-1, 20-2, . . . ) are connected to the other ends of bit lines BL and $\overline{BL}$ via first transfer gates 30 (30-1, 30-2, . . . ). Latch-type memory cells are connected to input/output lines I/O and $\overline{I/O}$ via second transfer gates 40 (40-1, 40-2, . . . ).

FIGS. 2A, 2B, 2C, and 2D are timing charts for explaining operations in the arrangement shown in FIG. 1. In a read mode, the signals $\overline{RAS}$ and $\overline{CAS}$ are provided in the order shown in FIGS. 2A and 2B, as control signals to the inner units of the dRAM from an external CPU or the like. When $\overline{RAS}$ is enabled, word line MW is also enabled. Then, the voltage of bit line BL is detected by the sense amplifier and the logic level ("1" or "0") is determined. Bit line BL is kept at the detected logic level and word line MW is disabled. On the other hand, by enabling $\overline{CAS}$, CSL is enabled and a given column is designated. Then, readout of the data is started. At this time, in order to smoothly read out the data, a certain relationship between the input timings of the signals must be kept. In other words, signal CSL for selecting a column line must be enabled after initialization of sense amplifiers SA is completed. This relationship between the input timings may be the same as that in the conventional dRAM.

When the conventional dRAM is in the write mode, signals $\overline{RAS}$ and $\overline{CAS}$ are input from the external CPU or the like in the order stated, i.e. the same as in the case of the read mode, word line MW is enabled in response to $\overline{RAS}$, and the voltage of bit line BL is detected by the sense amplifier. The detected logic level is determined and bit line BL is kept at the detected logic level. On the other hand, $\overline{CAS}$ is enabled in response to a signal from the external CPU or the like and thereafter CSL is enabled, thus selecting and determining the column line. At this time, in order to write the data correctly, word line MW must be disabled after the above-described sense amplifier is initialized. f this order is reversed, a normal write operation cannot be performed.

When $\overline{RAS}$ is enabled before $\overline{CAS}$, however, time t RCD (i.e., period between the enabling of RAS and that of CAS) will become longer in the case where a latch-type memory cell is connected between each bit line and each input/output line, thereby to precharge the bit line while $\overline{RAS}$ is active. If time t RCD becomes longer, word line MW will be disabled before CSL is enabled. Consequently, the timing of generating RAS and CAS is limited.

On the other hand, when the gating is performed such that word line MW is disabled after CSL has been enabled, an ample gating margin is required, inevitably making it difficult to ensure a high-speed data write operation. Further, when the gating is performed in such a way, it is necessary to delay the rising of $\overline{RAS}$ by the same period as the enabling of word line MW has been delayed.

According to the present invention, the input order of $\overline{RAS}$ and $\overline{CAS}$ in the write mode of the conventional dRAM is reversed to that in the read mode, thereby preventing abnormal write operations due to the reversed order of active periods of the sense amplifiers and CSL. Therefore, the timings of $\overline{RAS}$ and $\overline{CAS}$ can be freely set, thus realizing a stable operation in the write mode.

FIG. 3 shows a detailed arrangement of the dRAM in FIG. 1. In FIG. 3, dRAM cells and dummy cells MC and DC are of well known type which include MOS transistors and capacitors, respectively. The reference voltage terminal of each capacitor is connected to plate power supply VPL. Dummy cells DC1 and DC2 include n-channel MOS transistors Q9 and Q10, respectively. Bit line sense amplifier 10 comprises a flip-flop including n-channel MOS transistor pair (Q4 and QS), and a flip-flop including p-channel MOS transistor pair (Q6 and Q7). Enable signals φse and $\overline{\phi se}$ are input to the common sources of the respective pairs. Precharge circuit 50 comprises three n-channel MOS transistors Q1 to Q3 each gate of which commonly receives equalize signal EQL1. Reference numerals Q1 and Q2 denote precharge transistors. The sources of transistors Q1 and Q2 are respectively connected to bit lines BL and $\overline{BL}$, and the drains of them are commonly connected to precharge power supply VBL. Reference numeral Q3 denotes the MOS transistor for equalizing the bit lines, its source and drain being respectively connected to bit lines BL and $\overline{BL}$.

Latch-type memory cell 20 comprises a flip-flop including n-channel MOS transistor pair (Q18 and Q19), and a flip-flop including p-channel MOS transistor pair (Q21 and Q22). The sources of each transistor pair receive latch clocks φCE and $\overline{\phi CE}$. Reference numeral Q20 denotes an n-channel MOS transistor for equalizing. Nodes A and $\overline{A}$ of such a latch-type memory cell 20 are respectively connected to bit lines BL and $\overline{BL}$ through n-channel MOS transistors Q16 and Q17 included in first transfer gate 30. These nodes A and $\overline{A}$ are also connected to input/output lines I/O and $\overline{I/O}$ through n-channel MOS transistors Q23 and Q24 included in second transfer gate 40, respectively. First transfer gate 30 is controlled by clock φT. Second transfer gate 40 is connected to column select line CSL selected by a column address.

Figure 4:
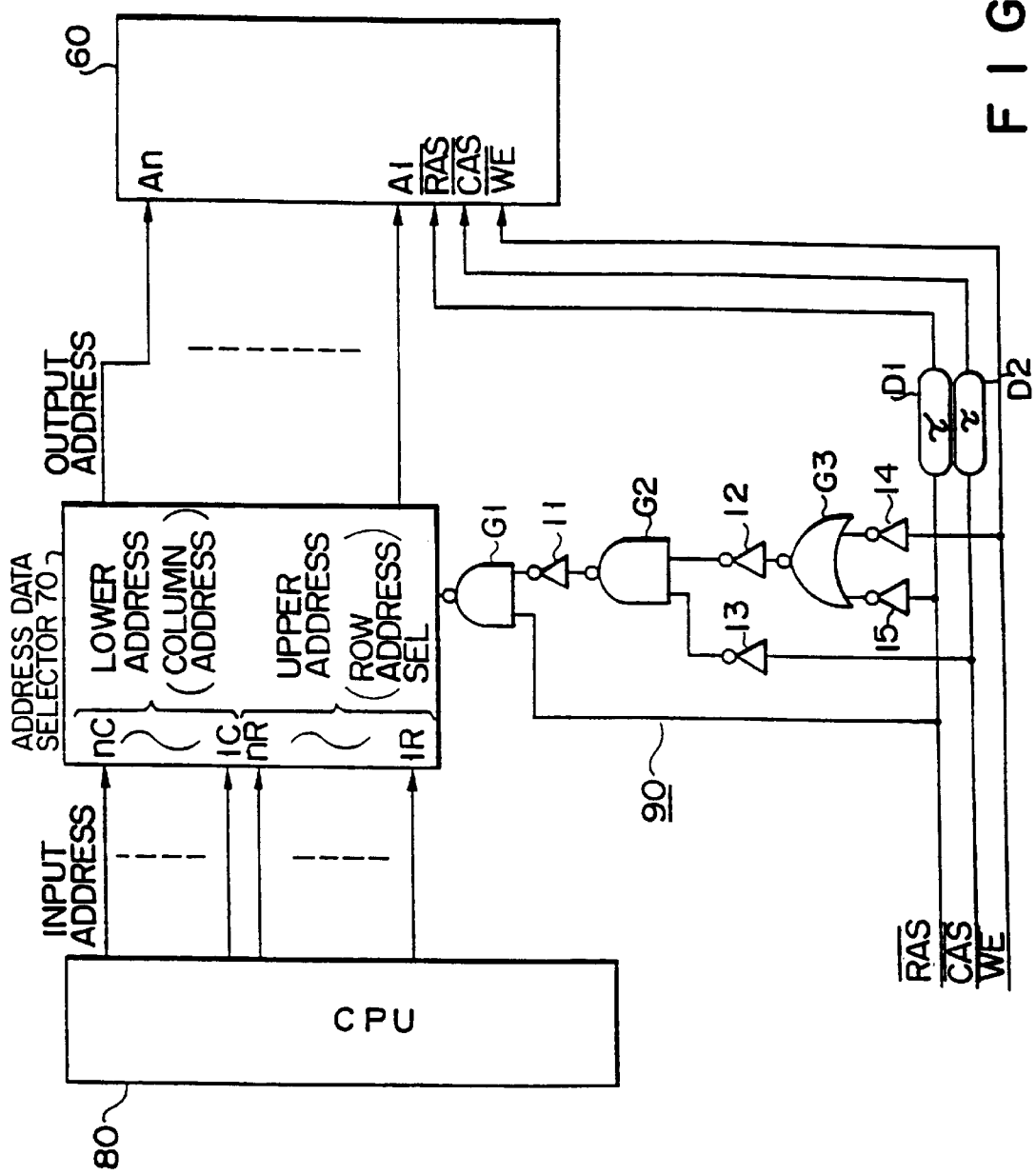
FIG. 4 is a diagram showing an arrangement of a control circuit of a dRAM chip shown in the arrangement of FIG. 1.

FIG. 4 shows an arrangement of an external control circuit outside the dRAM chip, for differentiating an input order of row and column addresses during a read cycle from that during a write cycle in the dRAM of the above embodiment. Address data selector 70 for address multiplexing is arranged between dRAM chip 60 and CPU 80. This address data selector 70 multiplexes input row and column addresses so that the upper n bits may be defined as a column address, and the lower n bits may be defined as a row address. Then, the multiplexed addresses are supplied to address terminals of dRAM chip 60. Address selector 70 includes a select control terminal SELECT for selecting an address which of the lower column and upper row addresses is to be output first. Gate circuit 90 is arranged to supply "0" or "1" to the control terminal SELECT in correspondence with a combination of $\overline{RAS}$, $\overline{CAS}$, and trigger signal $\overline{WE}$. At first, all of $\overline{RAS}$, $\overline{CAS}$, and $\overline{WE}$ are set at level "1".

When $\overline{RAS}$ is set at level "0", control signal "1" is output to the control terminal SELECT from gate circuit 90, and a row address is output from address data selector 70 prior to a column address. After that, when $\overline{CAS}$ is set at "0", the control signal goes "0" and column address is output. These operations are during the read cycle. During the write cycle, $\overline{CAS}$ and $\overline{WE}$ go "0" prior to $\overline{RAS}$, and the column address is output prior to the row address in response to control signal "0" from gate circuit 90. Subsequently, when $\overline{RAS}$ goes "0", the control signal is set at "1", thereby outputting the row address.

Note that, in FIG. 4, delay circuits D1 and D2 are arranged at input terminal sections of $\overline{RAS}$ and $\overline{CAS}$ so as to provide a set-up time to an input address of dRAM chip 60.

An operation during the read cycle of the dRAM having the above arrangement will be described below with reference to FIGS. 5A to 5W. FIGS. 5A to 5N show signal waveforms when data of the latch-type memory cell is transferred to the input/output line while performing a bit-line precharge in the system for precharging the bit line to be (½) $V_{DD}$. At first, the level of bit line equalize signal EQL1 (FIG. 5M) is set at $V_{DD}$, and the level of bit line precharge power supply VBL (not shown) is set at (½) $V_{DD}$. Therefore, bit lines BL and $\overline{BL}$ (FIGS. 5P and 5Q) are all precharged to be (½) $V_{DD}$. Assume that, in ith bit line pair (BLi and $\overline{BLi}$), $V_{DD}$ (logic "1") is written in node N1 (FIG. 5V) of a capacitor of dRAM cell MC1. Also assume that node N3 of a capacitor of dummy cell DC2 (FIG. 5W) is initialized at the level of (½) $V_{DD}$ by write power supply VDC.

When clock $\overline{RAS}$ (FIG. 5A) is set at logic "0" (VIL) from logic "1" (VIH) and is enabled, equalize signal EQL1 (FIG. 5M) is decreased from $V_{DD}$ to $V_{SS}$ and bit lines BL and $\overline{BL}$ are disconnected from each other. In addition, EQL2 (FIG. 5N) is also decreased from $V_{DD}$ to $V_{SS}$ and the memory node of the dummy cell is set in a floating state. For example, if word line MW1 (FIG. 5E) is selected and the level thereof and the level of dummy word line DW2 (FIG. 5F) are increased such that the voltage $V_{SS}$ is 1.5 times that of $V_{DD}$, the contents of dRAM cell MC1 and dummy cell DC2 are read out at bit lines BL and $\overline{BL}$ (FIGS. 5P and 5Q), respectively. Note that equalize signal EQL3 (FIG. 5O) of latch-type memory cell 20 is decreased from $V_{DD}$ to $V_{SS}$ just before this reading. Subsequently, n-channel sense enable signal φSE (FIG. 5I) decreases from the ½ $V_{DD}$ level to the $V_{SS}$ level, and p-channel sense enable signal φSE (FIG. 5H) also rises from the ½ $V_{DD}$ level to the $V_{DD}$ level. Therefore, bit line BL (FIG. 5P) at the side where the data of logic "1" is read out is increased to $V_{DD}$, and bit line $\overline{BL}$ (FIG. 5Q) in which the data of dummy cell DC2 is read out is decreased to $V_{SS}$.

Clock φT (FIG. 5J) changes from $V_{SS}$ to $V_{DD}$, and first transfer gate 30 is turned on. When the latch signals φCE and $\overline{\phi CE}$ (FIGS. 5K and 5L) change from (½) $V_{DD}$ to $V_{DD}$ and $V_{SS}$, respectively, the contents of bit lines BL and $\overline{BL}$ (FIGS. 5P and 5Q) are transferred to nodes A and $\overline{A}$ (FIGS. 5R and 5S) respective of the latch-type memory cell 20. Thus, if external write trigger signal $\overline{WE}$ (not shown) outside the dRAM chip is set at logic "1" in the read mode when the data of BL and $\overline{BL}$ are transferred to latch-type memory cell 20, bit line precharge is auto-matically started. The operation will be described hereinafter in detail.

After the selected and readout memory cell MC1 is sufficiently restored (i.e., rewritten on refreshed), the select and dummy word lines MW1 (FIG. 5E) and DW2 (FIG. 5F) are decreased from (⅔) $V_{DD}$ to $V_{SS}$, and these lines are not selected. After that, clock φT (FIG. 5J) is decreased from $V_{DD}$ to $V_{SS}$, and latch-type memory cell 20 is disconnected from bit lines BL and $\overline{BL}$. Bit line equalize signal EQL1 (FIG. 5M) is increased from $V_{SS}$ to $V_{DD}$, and precharge circuit 50 is operated, thus precharging the bit lines. At this time, $\overline{CAS}$ clock (FIG. 5B) goes from logic "1" to logic "0". Therefore, if, e.g., an ith column is selected, the level of column select line CSLi (FIG. 5G) is increased from $V_{SS}$ to $V_{DD}$ or to a boosted voltage of (⅔) $V_{DD}$. Second transfer gate 40 is turned on and nodes A and $\overline{A}$ (FIGS. 5R and 5S) of latch-type memory cell 20 are connected to input/output lines I/O and $\overline{I/O}$ respectively. In this case, I/O (FIG. 5T) is kept at level $V_{DD}$, and $\overline{I/O}$ (FIG. 5U) is decreased from $V_{DD}$ to $V_{SS}$, and output terminal DOUT outputs logic "1".

According to the embodiment as described above, by arranging the latch-type memory cells at the bit lines and temporarily storing the readout data therein, the bit lines can be precharged when $\overline{RAS}$ is enabled.

FIGS. 6A to 6Y show signal waveforms for explaining an operation during the write cycle. During the write cycle, $\overline{CAS}$ (FIG. 6B) goes from "1" to "0" (active) prior to $\overline{RAS}$ (FIG. 6A). At the same time, write trigger signal $\overline{WE}$ (FIG. 6C) goes to "0" (active). Therefore, a column address is input to the dRAM chip prior to a row address. If, e.g., an ith column is selected, column select line CSLi (FIG. 6I) is not enabled at this time. However, the column address is latched by a column decoder for selecting the column select line.

FIG. 7 shows a main part of the column decoder. When $\overline{CAS}$ goes "0" prior to $\overline{RAS}$, and $\overline{RAS}$ goes "0", AND gate 100 is enabled since the first and second inputs of AND gate 100 are both "1". Column address Aci is input to the dRAM chip, and output from a column address buffer. Output Aci is supplied to AND gate 100 as tho third input. Since AND gate 100 is enabled, Aci is output through an inverter as CSLi.

A write system circuit (not shown) is operated and a data-in buffer is then operated, thus enabling the sense amplifiers of input/output lines I/O and $\overline{I/O}$. For example, if input data is set at "0", in this case, I/O (FIG. 6V) is decreased from $V_{DD}$ to $V_{SS}$, and $\overline{I/O}$ (FIG. 6W) is kept at $V_{DD}$.

When $\overline{RAS}$ goes from "1" to "0" after $\overline{WE}$ and $\overline{CAS}$ respectively go from "1" to "0" (FIGS. 6A to 6C), equalize signal EQL1 to EQL3 (FIGS. 6O and 6Q) are decreased from $V_{DD}$ to $V_{SS}$, and bit lines BLi and $\overline{BLi}$ (FIGS. 6R and 6S) and nodes Ai and $\overline{Ai}$ (FIGS. 6T and 6U) of latch-type memory cells are set at ½ $V_{DD}$ level, in a floating state. The levels of word line MW1 (FIG. 6G) and dummy word line DW2 (FIG. 6H) are increased from $V_{SS}$ to (⅔) $V_{DD}$ in response to the input row address (FIG. 6D). At the same time, column select line CSLi (FIG. 6I) is increased from $V_{SS}$ to $V_{DD}$ in response to column address Aci which was already input to the column decoder (AND gate 100 in FIG. 7), and clock φT (FIG. 6L) is also increased from $V_{SS}$ to $V_{DD}$. Therefore, first and second transfer gates 30 and 40 are turned on, and bit lines BLi and $\overline{BLi}$ connected to input/output lines I/O and $\overline{I/O}$, respectively.

Subsequently, n-channel sense amplifier enable signal $\overline{\phi SE}$ (FIG. 6K) and memory cell latch signal $\overline{\phi SE}$ (FIG. 6N) are simultaneously decreased from (½) $V_{DD}$ to $V_{SS}$. P-channel sense amplifier enable signal φSE (FIG. 6J) and memory cell latch signal φCE (FIG. 6M) are simultaneously increased from (½) $V^{DD}$ to $V_{DD}$, and the data is written in the selected memory cell and non-selected memory cells connected to word line MN are restored. More specifically, since node N1 of the selected dRAM cell MC1 and node N2 of dummy cell DC2 are 5 respectively connected to bit lines BLi and $\overline{BLi}$, node N1 (FIG. 6X) is decreased from $V_{DD}$ to $V_{SS}$ and logic "0" is written in dRAM cell Mc1 of bit line BLi. Therefore, node N3 (FIG. 6R) is increased from (½) $V_{DD}$ to $V_{DD}$.

After the non-selected memory cell is sufficiently restored (refreshed), word line MW1 (FIG. 6G) and dummy word line DW2 (FIG. 6H) are decreased from (⅔) $V_{DD}$ to $V_{SS}$, these lines are not selected. At substantially the same time, clock φT (FIG. 6L) is decreased from $V_{DD}$ to $V_{SS}$, and latch-type memory cell 20 is disconnected from is bit lines BL and $\overline{BL}$. Therefore, bit line equalize signal EQL1 (FIG. 6O) is increased from $V_{SS}$ to $V_{DD}$, precharge of the bit lines is started. At the same time, equalize signal EQL2 (FIG. 6P) is increased from $V_{SS}$ to $V_{DD}$, and an initialization level of (½) $V_{DD}$ is written in dummy cells DC1 and DC2.

When write trigger signal $\overline{WE}$ (FIG. 6C) returns from "0" to "1", the operation of the write system circuit is stopped and the operation Af the read system circuit is started. Data of ith latch-type memory cell 20 is out-put from a data-out buffer (not shown). In this case, since logic level "0" is written, "0" is output.

When $\overline{CAS}$ (FIG. 6B) goes from "0" to "1", the data-out buffer and input/output lines are reset. However, latch-type memory-cell 20 is not reset.

When $\overline{RAS}$ (FIG. 6A) finally returns from "0" to "1", equalize signal EQL3 (FIG. 6Q) is increased to $V_{DD}$, thus resetting latch-type memory cell.

FIGS. 8A and 8B respectively show a word line driving circuit and its operation timing. During period τ1 after $\overline{RAS}$ aces from "1" to "0", word line MW is enabled. Word line MW is kept at logic "1" only during period τ2 and is then automatically disabled.

According to the embodiment shown in FIGS. 3 and 4, by arranging latch-type memory cell 20 for each bit line pair (BL and $\overline{BL}$), the bit line can be precharged when RAS is enabled. A column select line is selected in response to $\overline{CAS}$ and sense data is externally output, so that the data is readout. During the write cycle, $\overline{CAS}$ is input prior to $\overline{RAS}$ and the write circuit system is operated to receive the data in input/output lines I/O and $\overline{I/O}$. The bit line sense amplifier is operated in response to $\overline{RAS}$, and the data is written and the non-selected line is restored. After that, the bit line can be precharged when $\overline{RAS}$ is enabled, in the same manner as during the read cycle.

The effect of the present invention as described above is as follows. In this embodiment, during the write cycle, since $\overline{CAS}$ is input prior to $\overline{RAS}$, a sufficient time margin can be obtained until a word line is turned off after column select line CSL is enabled. Therefore, as during the read cycle, the cycle time is substantially determined in response to $\overline{RAS}$ during the write cycle. Hence, the , timing of enabling $\overline{RAS}$ is not influenced by the timing of enabling $\overline{CAS}$, thus ensuring a high-speed write operation of the dRAM and an easy designing thereof.

When write trigger signal $\overline{WE}$ returns from "0" to "1", $\overline{CAS}$ is toggled while $\overline{RAS}$ is at level "0" and a column address is input. Then, the data of latch-type memory cell can be readout at random. Even if the column address is not input and only $\overline{CAS}$ is toggles, the data can be serially readout.

The present invention is not limited to the above embodiment. For example, as shown in FIG. 9, n-channel MOS transistors Q25 and Q26 may be added to second transfer gate 40 in the above embodiment, and the gates of these transistors may be driven in response to clock $\phi W$ which is enabled at substantially the same time as the word line is selected during both the read and write cycles. Thus, during the write cycle in which $\overline{CAS}$ is set at "0" prior to $\overline{RAS}$, as soon as the column address is input to the dRAM chip, the selected column select line CSL can be increased from $V_{SS}$ to $V_{DD}$ or $(\frac{3}{2}) V_{DD}$.

According to the embodiment shown in FIG. 1, latch-type memory cells are arranged at respective bit lines and an address input order during the write cycle is reversed to that during he read cycle. Therefore, the cycle time can be shortened. In the conventional dRAM arrangement without such a latch-type memory cell, the input order of the row and column addresses during the write cycle can be differentiated from that during the read cycle.

Various changes and modifications of the present invention may be effected without departing from the spirit or scope of the invention as defined in the appended claims.

What is claimed is:

1. A semiconductor memory device which receives a row address strobe (RAS) signal and a column address strobe (CAS) signal from an external device, comprising:
   rewritable memory cells formed on a semiconductor substrate;
   a plurality of bit lines;
   a plurality of word lines; and
   first and second transfer gates;
   wherein said first transfer gate is connected between the bit lines and said second transfer gate,
   said second transfer gate is connected between said first transfer gate and an input/output (I/O) line and controlled by a column select line (CSL),
   said first transfer gate is driven in response to a clock signal which is enabled at substantially the same time as a word line of said plurality of word lines is selected during both read and write cycles, and
   a voltage applied to the CSL is increased the same time a level of a selected word line is increased,
   whereby, during a write cycle in which the CAS signal is enabled prior to the RAS signal, a selected CSL can be increased from a first voltage (VSS) to one of a second voltage (Vdd) and $\frac{3}{2}$ Vdd as soon as a column address is input.

2. A semiconductor memory device which receives a row address strobe (RAS) signal and a column address strobe (CAS) signal from an external device, comprising:
   rewritable memory cells (MC) formed on a semiconductor substrate;
   a plurality of bit lines (BL);
   a plurality of word lines (MW);
   first transfer gate (30-i) connected to the bit lines;
   a second transfer gate (40-i, Q23, Q24) connected between the first transfer gate and an input/output line (I/O) and controlled by a column select line (CSL); and
   a third transfer gate (40-i, Q25, Q26) connected between the first and second transfer gates, and controlled by a clock signal (ØW) which is enabled at substantially the same time as a word line is selected,
   wherein:
   during a write cycle in which the CAS signal is enabled prior to the RAS signal, a selected CSL can be increased from a first voltage (VSS) to one of a second voltage Vdd and $\frac{3}{2}$ Vdd as soon as a column address is input;
   during a read cycle, a clock signal ($\phi$T) for controlling the first transfer gate becomes active at a predetermined time after a word line is made active, and becomes inactive at substantially the same time as that word line is made inactive; and
   during a write cycle, the clock signal ($\phi$T) becomes active at substantially the same time as a word line is made active, and becomes inactive at substantially the same time as that word line is made inactive.

3. The semiconductor memory device according to claim 2, wherein, during a write cycle, the column select line (CSL) becomes active at substantially the same time as a word line and the clock signal ($\phi$T) are made active, and becomes inactive at a predetermined time after that word line and the clock signal ($\phi$T) are made inactive.

4. The semiconductor memory device according to claim 2, wherein, during a read cycle, the column select line (CSL) becomes active after a word line is made active, and becomes inactive at a predetermined time after that word line and the clock signal ($\phi$T) are made inactive.

5. The semiconductor memory device according to claim 2, wherein, during a write cycle, the third transfer gate is already turned on, and when the third transfer gate is turned off in a read cycle, damage of data in the rewritable memory cell is prevented.

6. A semiconductor memory device which receives a row address strobe (RAS) signal and a column address strobe (CAS) signal from an external device, comprising:
   rewritable memory cells (MC) formed on a semiconductor substrate;
   a plurality of bit lines (BL);
   a plurality of word lines (MW);
   a first transfer gate (30-i) connected to the bit lines;
   a second transfer gate (40-i, Q23, Q24) connected between the first transfer gate and an input/output line (I/O) and controlled by a column select line (CSL); and
   a third transfer gate (40-i, Q25, Q26) connected between the first and second transfer gates, and controlled by a clock signal (ØW) which is enabled at substantially the same time as a word line is selected,
   wherein:
   during a write cycle in which the CAS signal is enabled prior to the RAS signal, a selected CSL can be increased from a first voltage (VSS) to one of a second voltage Vdd and $\frac{3}{2}$ Vdd as soon as a column address is input;
   the third transfer gate (40-i, Q25, Q26) is enabled at the same time as a word line of said plurality of word lines is selected during both read and write cycles;

during a read cycle, a clock signal (φT) for controlling the first transfer gate becomes active at a predetermined time after a word line is made active, and becomes inactive at substantially the same time as that word line is made inactive; and during a write cycle, the clock signal (φT) becomes active at substantially the same time as a word line is made active, and becomes inactive at substantially the same time as that word line is made inactive.

7. The semiconductor memory device according to claim 6, wherein, during a write cycle, the column select line (CSL) becomes active at substantially the same time as a word line and the clock signal (φT) are made active, and becomes inactive at a predetermined time after that word line and the clock signal (φT) are made inactive.

8. The semiconductor memory device according to claim 6, wherein, during a read cycle, the column select line (CSL) becomes active after a word line is made active, and becomes inactive at a predetermined time after that word line and the clock signal (φT) are made inactive.

9. The semiconductor memory device according to claim 6, wherein, during a write cycle, the third transfer gate is already turned on, and when the third transfer gate is turned off in a read cycle, damage of data in the rewritable memory cell is prevented.

10. A semiconductor memory device which receives a row address strobe (RAS) signal and a column address strobe (CAS) signal from an external device, comprising:

rewritable memory cells (MC) formed on a semiconductor substrate;

a plurality of bit lines (BL);

a plurality of word lines (MW);

a first transfer gate (30-i) connected to the bit lines;

a second transfer gate (40-i, Q23, Q24) connected between the first transfer gate and an input/output line (I/O) and controlled by a column select line (CSL); and a third transfer gate (40-i, Q25, Q26) connected between the first and second transfer gates, and controlled by a clock signal (ØW) which is enabled at substantially the same time as a word line is selected, wherein:

during a write cycle in which the CAS signal is enabled prior to the RAS signal, a selected CSL can be increased from a first voltage (VSS) to one of a second voltage Vdd and ½ Vdd as soon as a column address is input;

during a read cycle, a clock signal (φT) for controlling the first transfer gate becomes active at a predetermined time after a word line is made active, and becomes inactive at substantially the same time as that word line is made inactive.

11. A semiconductor memory device which receives a row address strobe (RAS) signal and a column address strobe (CAS) signal from an external device, comprising:

rewritable memory cells (MC) formed on a semiconductor substrate;

a plurality of bit lines (BL);

a plurality of word lines (MW);

a first transfer gate (30-i) connected to the bit lines;

a second transfer gate (40-i, Q23, Q24) connected between the first transfer gate and an input/output line (I/O) and controlled by a column select line (CSL); and a third transfer gate (40-i, Q25, Q26) connected between the first and second transfer gates, and controlled by a clock signal (ØW) which is enabled at substantially the same time as a word line is selected, wherein:

during a write cycle in which the CAS signal is enabled prior to the RAS signal, a selected CSL can be increased from a first voltage (VSS) to one of a second voltage Vdd and ½ Vdd as soon as a column address is input;

the third transfer gate (40-i, Q25, Q26) is enabled at the same time as a word line of said plurality of word lines is selected during both read and write cycles;

during a read cycle, a clock signal (φT) for controlling the first transfer gate becomes active at a predetermined time after a word line is made active, and becomes inactive at substantially the same time as that word line is made inactive.

* * * * *